United States Patent
Fujihira et al.

(10) Patent No.: US 11,027,678 B2
(45) Date of Patent: Jun. 8, 2021

(54) ON-BOARD SYSTEM AND DETECTOR HUB

(71) Applicant: YAZAKI CORPORATION, Tokyo (JP)

(72) Inventors: Katsuya Fujihira, Shizuoka (JP); You Yanagida, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/874,685

(22) Filed: May 15, 2020

(65) Prior Publication Data
US 2020/0269782 A1 Aug. 27, 2020

Related U.S. Application Data

(63) Continuation of application No. PCT/JP2018/041513, filed on Nov. 8, 2018.

(30) Foreign Application Priority Data

Dec. 12, 2017 (JP) .............................. JP2017-237417

(51) Int. Cl.
*H04L 12/40* (2006.01)
*B60R 16/023* (2006.01)
(Continued)

(52) U.S. Cl.
CPC ....... *B60R 16/0238* (2013.01); *G05D 1/0088* (2013.01); *H04L 12/40* (2013.01);
(Continued)

(58) Field of Classification Search
CPC ... B60R 16/0238; G05D 1/0088; H04L 12/40; H05K 7/026; H01R 2201/26
See application file for complete search history.

(56) References Cited

U.S. PATENT DOCUMENTS

2019/0129417 A1 5/2019 Nota et al.
2020/0234191 A1* 7/2020 Murahashi ............ B60W 40/09
2020/0391680 A1* 12/2020 Toyoda ............... B60R 16/0239

FOREIGN PATENT DOCUMENTS

JP 63-173746 A 7/1988
JP 2006-240603 A 9/2006
(Continued)

OTHER PUBLICATIONS

International Search Report and Written Opinion of the International Search Report for PCT/JP2018/041513 dated Feb. 5, 2019.

*Primary Examiner* — Tho D Ta
(74) *Attorney, Agent, or Firm* — Kenealy Vaidya LLP

(57) ABSTRACT

An on-board system includes: a plurality of detectors provided to a vehicle; a controller configured to control an on-board instrument mounted on the vehicle based on detection information indicating a result of detection by each of the detectors; a detector hub interposed between each of the detectors and the controller in an intercommunicatable manner and configured to collect the detection information obtained by the detectors and transmit the collected detection information to the controller; a first network connecting the on-board instrument and the controller in an intercommunicatable manner; and a second network independent from the first network and connecting the detectors, the detector hub, and the controller in an intercommunicatable manner. As a result, the on-board system and the detector hub can achieve appropriate communication.

9 Claims, 4 Drawing Sheets

(51) Int. Cl.
*G05D 1/00* (2006.01)
*H05K 7/02* (2006.01)

(52) U.S. Cl.
CPC ......... *H05K 7/026* (2013.01); *H01R 2201/26* (2013.01); *H04L 2012/40273* (2013.01)

(56) References Cited

FOREIGN PATENT DOCUMENTS

| | | |
|---|---|---|
| JP | 2014-129074 A | 7/2014 |
| JP | 2015-162795 A | 9/2015 |
| JP | 2016-220055 A | 12/2016 |
| JP | 2017-199299 A | 11/2017 |

* cited by examiner

ON-BOARD SYSTEM AND DETECTOR HUB

CROSS-REFERENCE TO RELATED APPLICATION

This application is a continuation application of International Application No. PCT/JP2018/041513 filed on Nov. 8, 2018 which claims the benefit of priority from Japanese Patent Application No. 2017-237417 filed on Dec. 12, 2017 and designating the U.S., the entire contents of which are incorporated herein by reference.

BACKGROUND OF THE INVENTION

1. Field of the Invention

The present invention relates to an on-board system and a detector hub.

2. Description of the Related Art

An on-board information system having a network that enables intercommunication among a plurality of instruments mounted on a vehicle through a plurality of communication interfaces has been disclosed as a conventional on-board system mounted on a vehicle in, for example, Japanese Patent Application Laid-open No. 2015-162795.

For example, the on-board information system disclosed in the above-described Japanese Patent Application Laid-open No. 2015-162795 is required to mount various kinds of instruments in accordance with recent growth of automated vehicle driving. In this case as well, the on-board information system is desired to achieve more appropriate communication, which has room for further improvement.

SUMMARY OF THE INVENTION

The present invention is intended to solve the above-described problem and provide an on-board system and a detector hub that are capable of achieving appropriate communication.

In order to achieve the above mentioned object, an on-board system according to one aspect of the present invention includes a plurality of detectors provided to a vehicle; a controller configured to control an on-board instrument mounted on the vehicle based on detection information indicating a result of detection by each of the detectors; a detector hub interposed between each of the detectors and the controller in an intercommunicatable manner and configured to collect the detection information obtained by the detectors and transmit the collected detection information to the controller; a first network connecting the on-board instrument and the controller in an intercommunicatable manner; and a second network independent from the first network and connecting the detectors, the detector hub, and the controller in an intercommunicatable manner, wherein the first network connects the on-board instrument and the controller through a protocol conversion unit configured to perform protocol conversion in an intercommunicatable manner by a plurality of protocols different from each other, and the second network connects the detectors, the detector hub, and the controller in an intercommunicatable manner by a single protocol without the protocol conversion unit.

According to another aspect of the present invention, in the on-board system, it is possible to configure that a plurality of the detector hubs are provided and each collect the detection information obtained by the detectors different from each other, and the second network includes a network having a ring shape in which the detector hubs are connected in an intercommunicatable manner.

According to still another aspect of the present invention, in the on-board system, it is possible to configure that the detector hub includes an anomaly determination unit configured to determine anomaly of the detectors.

According to still another aspect of the present invention, in the on-board system, it is possible to further include a coiled code connecting the detector hub and one of the detectors.

In order to achieve the above mentioned object, a detector hub according to still another aspect of the present invention includes a detector connection portion connected with a plurality of detectors provided to a vehicle in an intercommunicatable manner; a controller connection portion connected with a controller in an intercommunicatable manner, the controller being configured to control an on-board instrument mounted on the vehicle based on detection information indicating a result of detection by each of the detectors; and a communication processing unit configured to collect the detection information obtained by the detectors and transmit the collected detection information to the controller, wherein the on-board instrument and the controller are connected in an intercommunicatable manner through a first network, the detectors and the detector connection portion, the controller connection portion and the controller are connected in an intercommunicatable manner through a second network independent from the first network, the first network connects the on-board instrument and the controller through a protocol conversion unit configured to perform protocol conversion in an intercommunicatable manner by a plurality of protocols different from each other, and the second network connects the detectors and the detector connection portion, the controller connection portion and the controller in an intercommunicatable manner by a single protocol without the protocol conversion unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of the present invention will be described below in detail with reference to the accompanying drawings. The present invention is not limited by the present embodiment. Components in the embodiment described below include those easily replaceable by the skilled person in the art or equivalent in effect.

Embodiment

Figure 1:
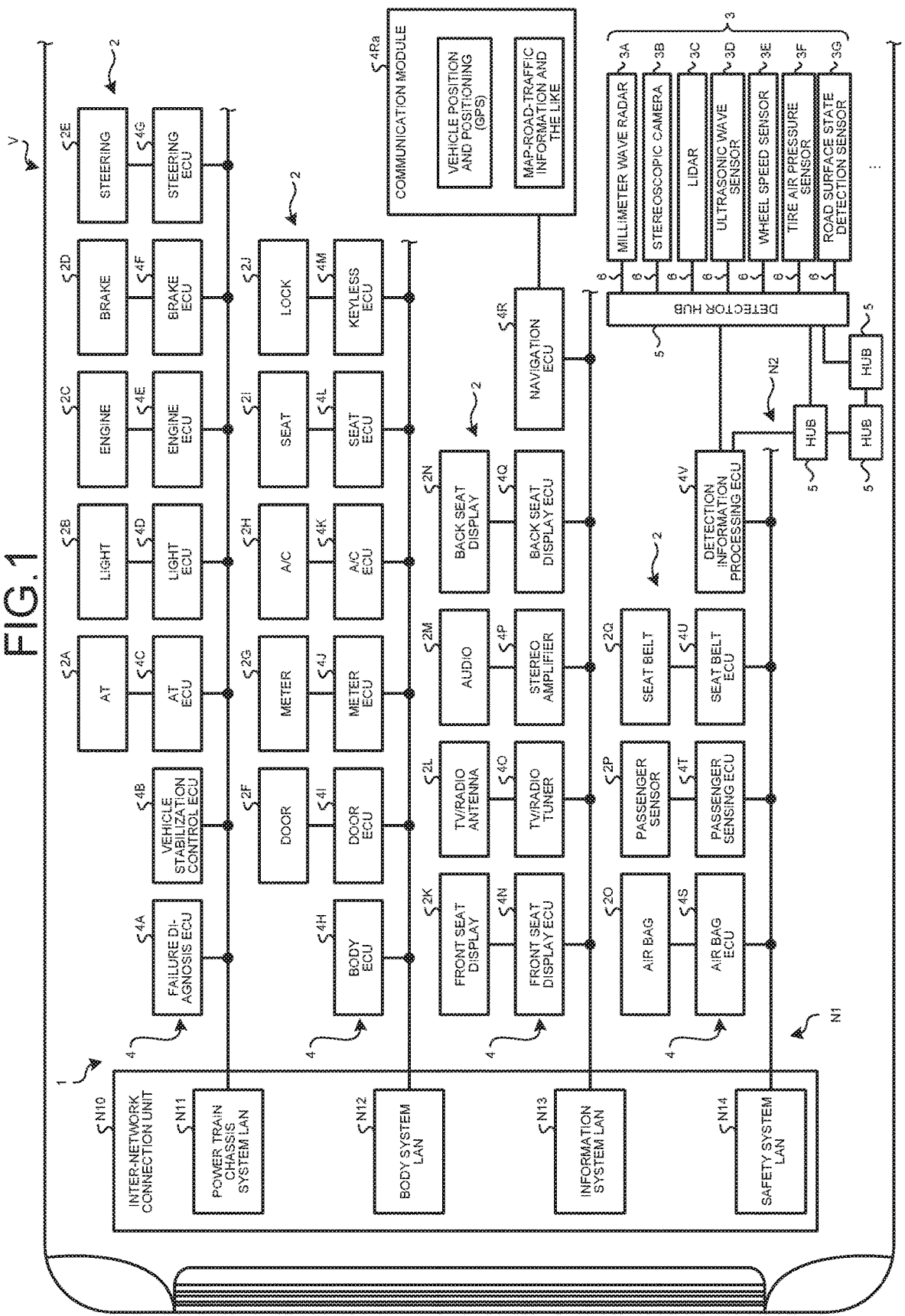
FIG. 1 is a block diagram of a schematic configuration of an on-board system according to an embodiment.

An on-board system 1 according to the present embodiment illustrated in FIG. 1 is an on-board network system that is mounted on a vehicle V and in which a plurality of detectors 3 are collected through a detector hub 5 in the vehicle V. The on-board system 1 is achieved by mounting the components illustrated in FIG. 1 on the vehicle V. Hereinafter, the configuration of the on-board system 1 will be described below in detail with reference to each drawing.

Figure 2:
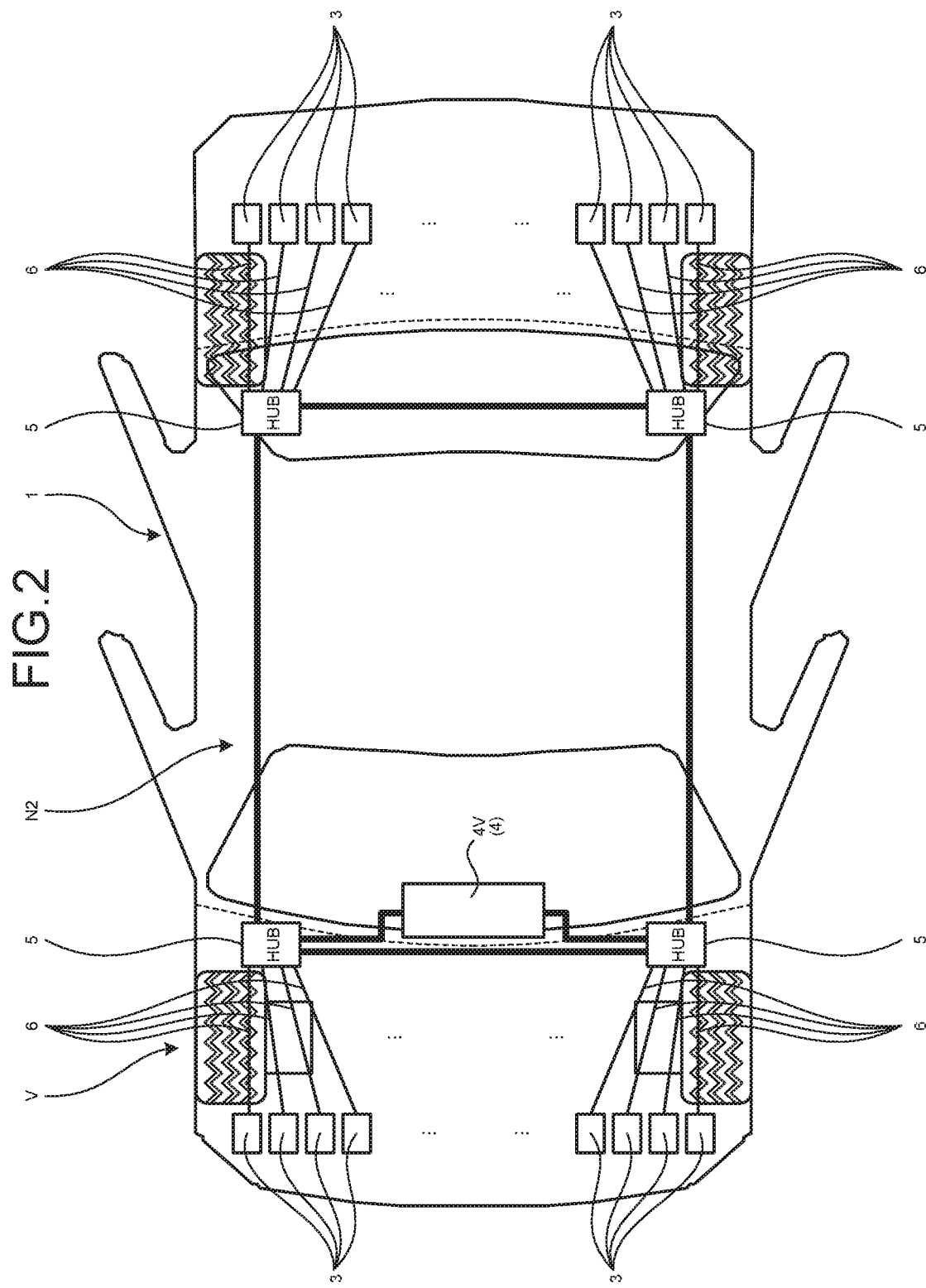
FIG. 2 is a block diagram for explaining disposition of a plurality of detector hubs included in the on-board system according to the embodiment.
Figure 3:
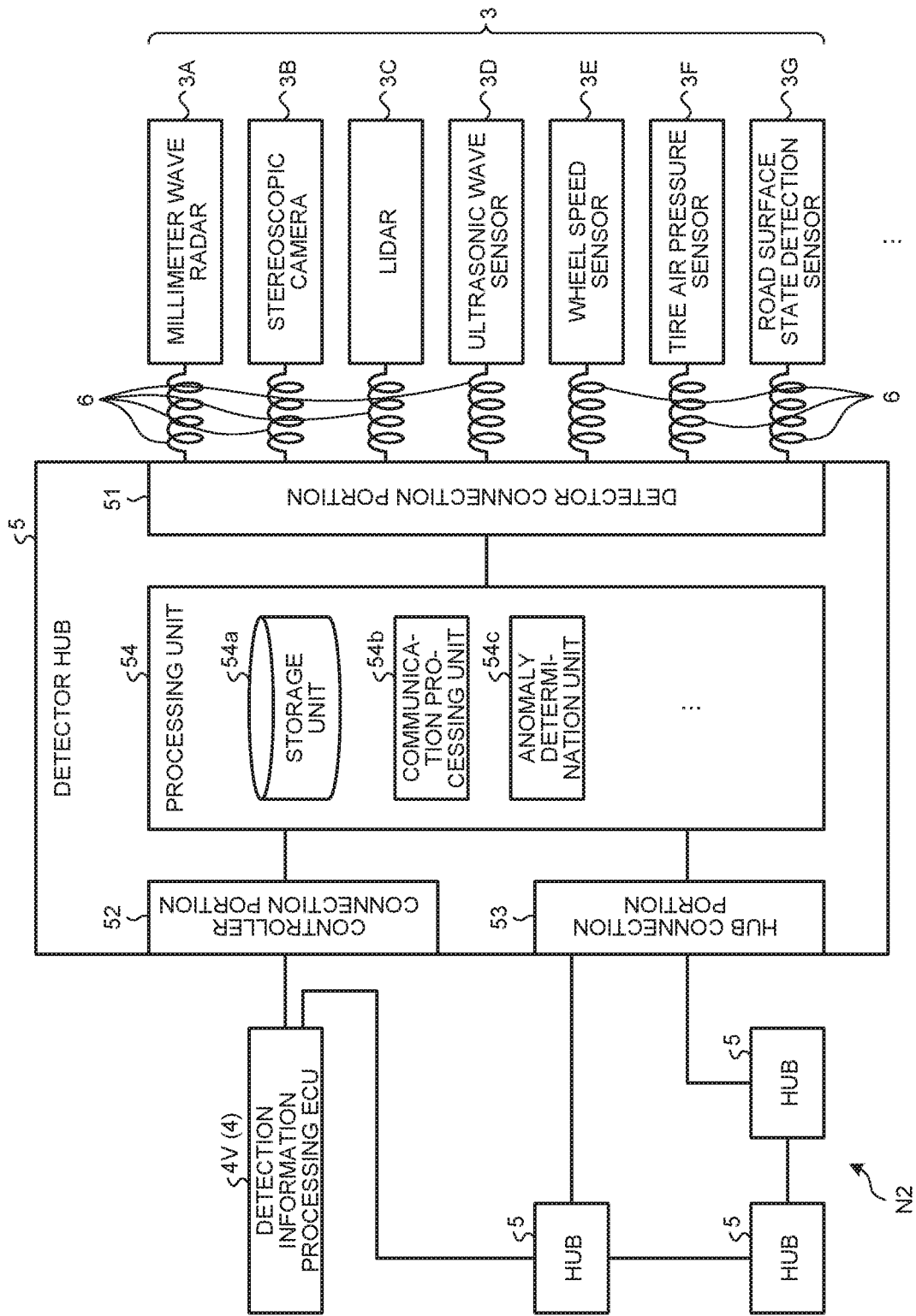
FIG. 3 is a block diagram of a schematic configuration of each detector hub included in the on-board system according to the embodiment.

In the on-board system 1 illustrated in FIG. 1, connection scheme between components for transmission and reception of electrical power supply, control signals, various kinds of information, and the like may be wired connection (including optical communication through optical fibers, for example) through wiring members such as electrical lines and optical fibers, or wireless connection such as wireless communication and non-contact power supply, unless otherwise stated. The vehicle V to which the on-board system 1 is applied may be any vehicle that uses a motor or an engine as a drive source, such as an electric vehicle (EV), a hybrid vehicle (HEV), a plug-in hybrid vehicle (PHEV), a gasoline vehicle, or a diesel vehicle. Driving of the vehicle V may be, for example, any of manual driving by a driver, semi-automated driving, and automated driving. In FIGS. 1, 2, and 3 described below, all or some of a plurality of provided detector hubs 5 are each abbreviated as "HUB".

Specifically, as illustrated in FIGS. 1 and 2, the on-board system 1 includes a plurality of on-board instruments 2, the detectors 3, a controller 4, the detector hubs 5, and a coiled code 6. In addition, the on-board system 1 includes a first network N1 and a second network N2 as on-board local area networks (LANs) connecting these components in an intercommunicatable manner.

Each on-board instrument 2 is an instrument mounted on the vehicle V to achieve various kinds of functions. The on-board instruments 2 are provided to the vehicle V. For example, the on-board instruments 2 may be installed on the vehicle V at manufacturing of the vehicle V or may be what is called an "after product" installed on the vehicle V after manufacturing of the vehicle V. The on-board instruments 2 may include, for example, a traveling system actuator, a power source system instrument, a vehicle environment system instrument, and a multimedia system instrument. Examples of the traveling system actuator may include a traveling power train (engine, motor generator, and transmission) as a drive device configured to cause the vehicle V to travel, a steering device configured to steer the vehicle V, and a braking device configured to brake the vehicle V. Examples of the power source system instrument may include electrical storage devices such as a battery and a capacitor, an alternator, a motor generator, a power source distributer, a power source system switching mechanism, a power-source control box, an inverter, and a converter. Examples of the vehicle environment system instrument may include various illumination instruments such as a headlight, a tail lamp, and a room lamp, an air conditioner, a wiper instrument, a mirror, and a seat. Examples of the multimedia system instrument may include instruments such as a navigation device, an audio, a meter, and various displays. The on-board instruments 2 illustrated in FIG. 1 include, for example, an automatic transmission (AT) 2A, a light 2B, an engine 2C, a brake 2D, a steering 2E, a door 2F, a meter 2G, an air conditioner (A/C) 2H, a seat 2I, a lock 2J, a front seat display 2K, a TV/radio antenna 2L, an audio 2M, a back seat display 2N, an air bag 2O, a passenger sensor 2P, and a seat belt 2Q, but are not limited thereto. The AT 2A is included in above-described transmission. The light 2B is included in the above-described illumination instruments. The engine 2C is an internal combustion engine configured to generate traveling power and auxiliary machine driving power. The brake 2D is included in the above-described braking device. The steering 2E is included in the above-described steering device. The door 2F is attached to the vehicle body of the vehicle V and includes, for example, an electric power window. The meter 2G displays various kinds of measured values and information in the vehicle V. The air conditioner (A/C) 2H is included in the above-described air conditioner. The seat 2I is a component that is provided in the vehicle V and on which a passenger can be seated, and includes various kinds of adjustment mechanisms and a heater. The lock 2J locks the door 2F. The front seat display 2K is provided on the front-seat side in the vehicle V and displays various kinds of images. The TV/radio antenna 2L is an antenna configured to receive TV and radio electric waves. The audio 2M outputs audio information and music such as voice information and sound information. The back seat display 2N is provided on the back-seat side in the vehicle V and displays various kinds of images. The air bag 2O is a safety device configured to expand at collision to protect a passenger. The passenger sensor 2P senses a passenger in accordance with whether the seat 2I is occupied. The seat belt 2Q is a safety device configured to restrict a passenger to the seat 2I.

Each detector 3 is mounted on the vehicle V and detects various kinds of information. The detectors 3 are provided to the vehicle V. The detectors 3 may include, for example, a vehicle speed sensor, an acceleration sensor, a steering angle sensor, an acceleration pedal sensor, a brake pedal sensor, a shift position sensor, an air bag expansion switch, a direction indicator switch, a seat belt switch, a seat load sensor, a rain sensor, a humidity sensor, a temperature sensor, an ammeter/voltmeter, an image capturing device such as a CCD camera, various radars and sonar using infrared, millimeter wave, ultrasonic wave, and the like, a GPS receiver, various wireless communication instruments. For example, the detectors 3 illustrated in FIG. 1 include an automated driving system detection instrument configured to detect information used for automated driving of the vehicle V among automated driving system instruments mounted on the vehicle V to achieve automated driving of the vehicle V, but are not limited thereto. The automated driving system detection instrument typically includes a detector for monitoring the surroundings of the vehicle V. In this example, the detectors 3 include, as the automated driving system detection instruments, a millimeter wave radar 3A, a stereoscopic camera 3B, a Lidar 3C, an ultrasonic wave sensor 3D, a wheel speed sensor 3E, a tire air pressure sensor 3F, and a road surface state detection sensor 3G, but are not limited thereto. The millimeter wave radar 3A detects an object around the vehicle V by using millimeter electric waves. The stereoscopic camera 3B captures a stereoscopic image (three-dimensional image) of the surroundings of the vehicle V. The Lidar 3C is what is called a laser radar and detects an object around the vehicle V with a laser beam. The ultrasonic wave sensor 3D detects an object around the vehicle V by using ultrasonic waves. The wheel speed sensor 3E detects the rotational speed of each wheel of the vehicle V. The tire air pressure sensor 3F detects the air pressure of a tire mounted on each wheel of the vehicle V. The road surface state detection sensor 3G detects the state of a road surface on which each wheel of the vehicle V grounds. The detectors 3 output detection information indicating detection results to the controller 4 through the detector hubs 5 and the like.

The controller 4 collectively controls components of the on-board system 1. The controller 4 executes various kinds of arithmetic processing for controlling the on-board instruments 2 mounted on the vehicle V based on the detection information indicating a result of detection by each of the detectors 3. The controller 4 includes an electronic circuit mainly made of a publicly known microcomputer including a central processing unit such as a central processing unit (CPU), a micro processing unit (MPU), an application specific integrated circuit (ASIC), or a field programmable gate array (FPGA), a read only memory (ROM), a random access memory (RAM), and an interface. The controller 4 executes various computer programs and applications stored in a storage unit so that the computer programs and applications operate to output output signals to the components and execute various kinds of processing for achieving various kinds of functions. In this example, the controller 4 includes a plurality of electronic control units (ECUs). The controller 4 illustrated in FIG. 1 includes, for example, a failure diagnosis ECU 4A, a vehicle stabilization control ECU 4B, an AT ECU 4C, a light ECU 4D, an engine ECU 4E, a brake ECU 4F, a steering ECU 4G, a body ECU 4H, a door ECU 4I, a meter ECU 4J, an A/C ECU 4K, a seat ECU 4L, a keyless ECU 4M, a front seat display ECU 4N, a TV/radio tuner 4O, a stereo amplifier 4P, a back seat display ECU 4Q, a navigation ECU 4R, an air bag ECU 4S, a passenger sensing ECU 4T, a seat belt ECU 4U, and a detection information processing ECU 4V, but is not limited thereto. The failure diagnosis ECU 4A executes processing of diagnosing failure of each on-board instrument 2. The vehicle stabilization control ECU 4B executes processing of stabilizing the posture of the vehicle V. The AT ECU 4C controls operation of the AT 2A. The light ECU 4D controls operation of the light 2B. The engine ECU 4E controls operation of the engine 2C. The brake ECU 4F controls operation of the brake 2D. The steering ECU 4G controls operation of the steering 2E. The body ECU 4H collectively controls a body system of the vehicle V. The door ECU 4I controls operation of, for example, an electric power window of the door 2F. The meter ECU 4J controls operation of the meter 2G. The A/C ECU 4K controls operation of the A/C 2H. The seat ECU 4L controls operation of the seat 2I. The keyless ECU 4M controls operation of the lock 2J. The front seat display ECU 4N controls operation of the front seat display 2K. The TV/radio tuner 4O is a tuned circuit configured to select electric waves at a particular frequency from electric waves related to TV/radio or the like received by the TV/radio antenna 2L. The stereo amplifier 4P is an amplification circuit configured to amplify an electric signal in accordance with audio information and output the amplified electric signal from the audio 2M. The back seat display ECU 4Q controls operation of the back seat display 2N. The navigation ECU 4R executes processing related to navigation of the vehicle V. The navigation ECU 4R executes processing related to navigation of the vehicle V based on, for example, information related to the position and positioning (GPS) of the vehicle V, map-road-traffic information (big data from the outside of the vehicle), and the like that are acquired by a communication module 4Ra configured to perform communication with the outside of the vehicle V. The air bag ECU 4S controls operation of the air bag 2O.

The passenger sensing ECU 4T executes processing of sensing a passenger based on an output from the passenger sensor 2P. The seat belt ECU 4U controls operation of the seat belt 2Q. The detection information processing ECU 4V executes various kinds of processing on the detection information obtained by the detectors 3. For example, the detection information processing ECU 4V executes various kinds of processing such as sensing of travel environment of the vehicle V, sensing of any obstacle around the vehicle V, and white line sensing based on the detection information obtained by the detectors 3.

Each detector hub 5 is a line concentration device configured to collect connection destinations of the detectors 3. The detector hub 5 is interposed between each of the detectors 3 and the controller 4 in an intercommunicatable manner. In this example, the detector hub 5 is interposed between each of the detectors 3 and the detection information processing ECU 4V of the controller 4. The detector hub 5 has a function to collect the detection information obtained by the detectors 3 and transmit the collected detection information to the detection information processing ECU 4V of the controller 4. The detector hubs 5 according to the present embodiment are provided to the vehicle V and connected in an intercommunicatable manner. In this example, the four detector hubs 5 in total are correspondingly provided on the front-left side, the front-right side, the back-left side, and the back-right side, each of which tends to have the detectors 3 disposed thereon in a concentrated manner in the vehicle V. The detector hubs 5, in this example, the four detector hubs 5 collect the detection information obtained by the detectors 3 different from each other. The detector hubs 5 have substantially the same configuration, and thus the following description commonly applies to each detector hub 5 unless otherwise stated.

Specifically, as illustrated in FIG. 3, each detector hub 5 includes a detector connection portion 51, a controller connection portion 52, a hub connection portion 53, and a processing unit 54.

Figure 4:
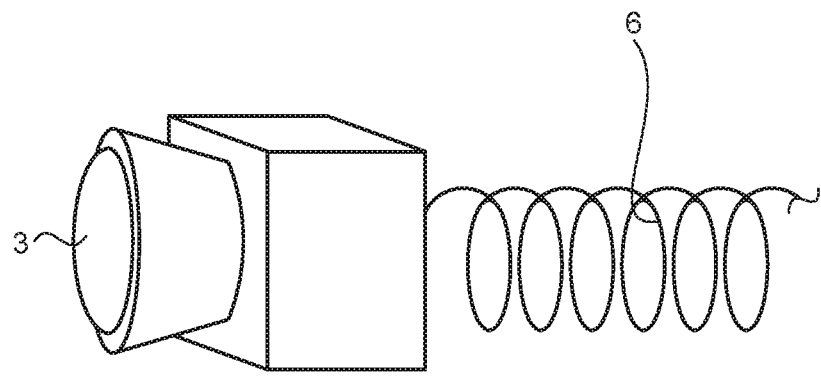
FIG. 4 is a schematic perspective view illustrating an exemplary coiled code included in the on-board system according to the embodiment.
Figure 5:
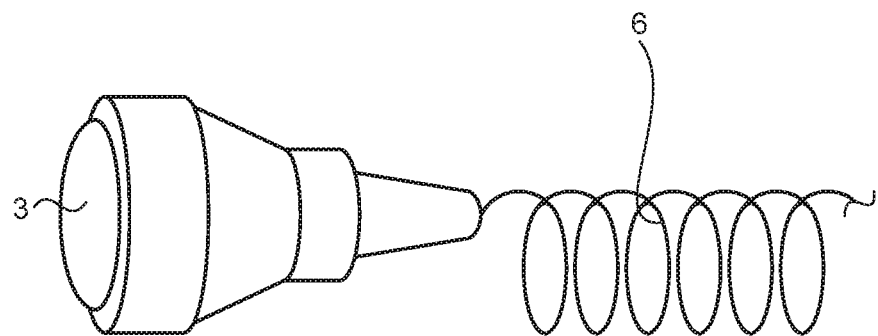
FIG. 5 is a schematic perspective view illustrating an exemplary coiled code included in the on-board system according to the embodiment.
Figure 6:
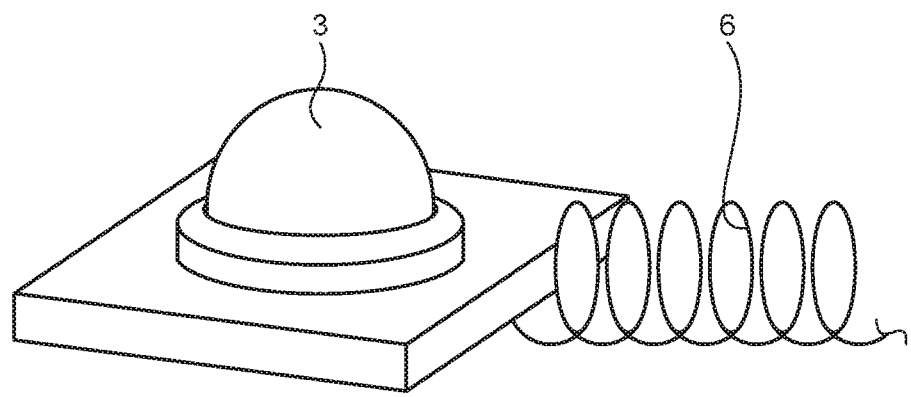
FIG. 6 is a schematic perspective view illustrating an exemplary coiled code included in the on-board system according to the embodiment.

The detector connection portion 51 is a part connected with the detectors 3 in an intercommunicatable manner. The controller connection portion 52 is a part connected with the detection information processing ECU 4V of the controller 4 in an intercommunicatable manner. The hub connection portion 53 is a part connected with another detector hub 5 in an intercommunicatable manner. In other words, the detector connection portion 51, the controller connection portion 52, and the hub connection portion 53 are each an interface for transmitting and receiving various kinds of information to and from each component. The detector connection portion 51, the controller connection portion 52, and the hub connection portion 53 each have a function to communicate information with each component through an electrical line or the like in a wired manner, a function to communicate information with each component through a wireless communication unit or the like in a wireless manner, and the like. In this example, the detector connection portion 51, the controller connection portion 52, and the hub connection portion 53 are each connected with each component through an electrical line or the like in a wired manner. In addition, the detector connection portion 51 is connected with each detector 3 through the coiled code 6 in a wired manner. The coiled code 6 is an electrical line that is wound in a helical shape in the extension direction as exemplarily illustrated in FIGS. 4, 5, and 6 and that can be freely expanded and contracted. Each coiled code 6 connects the detector connection portion 51 of the detector hub 5 and the detector 3 in an intercommunicatable and a wired manner.

The processing unit 54 is a part having a function to execute processing of collecting the detection information obtained by the detectors 3 and transmitting the collected detection information to the detection information processing ECU 4V of the controller 4. In this example, the processing unit 54 also has a function to execute processing of determining anomaly of each detector 3. The processing unit 54 includes an electronic circuit mainly made of a publicly known microcomputer including a central processing unit such as a CPU, an MPU, an ASIC, or an FPGA, a ROM, a RAM, and an interface. The processing unit 54 is connected with the detector connection portion 51, the controller connection portion 52, and the hub connection portion 53. The processing unit 54 can mutually transmit and receive various electric signals to and from each component. Specifically, the processing unit 54 functionally includes a storage unit 54*a*, a communication processing unit 54*b*, and an anomaly determination unit 54*c*.

The storage unit 54*a* is a storage device such as a memory. The storage unit 54*a* stores therein, for example, conditions and information necessary for various kinds of processing at the processing unit 54, various computer program and applications executed by the processing unit 54, and control data. In addition, the storage unit 54*a* can temporarily store various kinds of information detected by the detectors 3. These pieces of information are read as necessary from the storage unit 54*a* by the processing unit 54 or the like. The processing unit 54 executes various computer programs stored in the storage unit 54*a* based on various input signals or the like so that these computer programs operate to output signals to the components and execute various kinds of processing for achieving various kinds of functions.

The communication processing unit 54*b* can execute processing of collecting the detection information obtained by the detectors 3 and collectively transmitting the collected detection information to the detection information processing ECU 4V of the controller 4. For example, the communication processing unit 54*b* receives the detection information obtained by the detectors 3 through the detector connection portion 51 and temporarily collectively stores the received detection information in the storage unit 54*a*. Then, the communication processing unit 54*b* collects, for each constant data frame, the detection information of the detectors 3 collectively stored in the storage unit 54*a*, and collectively transmits the collected detection information to the detection information processing ECU 4V through the controller connection portion 52 at a constant timing.

The anomaly determination unit 54*c* can execute processing of determining anomaly of each detector 3. The anomaly determination unit 54*c* determines anomaly of the detector 3 based on, for example, an anomaly determination threshold. The anomaly determination threshold is a threshold set in advance to a sensing signal in accordance with the detection information of each detector 3. The anomaly determination threshold is stored in the storage unit 54*a*. The anomaly determination threshold is set to be, for example, a value larger than a physical quantity (such as a current value or a voltage value) in accordance with the sensing signal in a state in which each detector 3 is normally used. Then, the anomaly determination unit 54*c* determines that the detector 3 is normal when a physical quantity in accordance with the sensing signal of the detector 3 is smaller than the anomaly determination threshold. The anomaly determination unit 54*c* determines that the detector 3 is anomalous when the physical quantity in accordance with the sensing signal of the detector 3 is equal to or larger than the anomaly determination threshold. Then, for example, the communication processing unit 54*b* according to the present embodiment excludes the detection information of the detector 3 determined to be anomalous by the anomaly determination unit 54*c* from a group of pieces of information to be collectively transmitted by the detection information processing ECU 4V. Accordingly, the communication processing unit 54*b* does not transmit the detection information of the detector 3 determined to be anomalous by the anomaly determination unit 54*c* to the detection information processing ECU 4V. In this case, the communication processing unit 54*b* may further transmit detector anomaly information indicating that the detector 3 is anomalous to the detection information processing ECU 4V. The anomaly determination of the detector 3 by the anomaly determination unit 54*c* is not limited to the above-described method, but various kinds of well-known methods may be used.

As illustrated in FIG. 1, in the on-board system 1 configured as described above, the on-board instruments 2 and the controller 4 are connected in an intercommunicatable manner through the first network N1. The first network N1 is a communication network connecting the on-board instruments 2 and the controller 4 in an intercommunicatable manner. The first network N1 may be an optional wired or wireless communication network.

The first network N1 according to the present embodiment includes, for example, a power train chassis system LAN N11, a body system LAN N12, an information system LAN N13, a safety system LAN N14, and an inter-network connection unit N10. The power train chassis system LAN N11 is a network that mainly performs inter-instrument communication related to behavior control of the vehicle V. In this example, in the power train chassis system LAN N11, the failure diagnosis ECU 4A, the vehicle stabilization control ECU 4B, the AT ECU 4C, the light ECU 4D, the engine ECU 4E, the brake ECU 4F, and the steering ECU 4G are connected in an intercommunicatable manner. In the power train chassis system LAN N11, the AT ECU 4C, the light ECU 4D, the engine ECU 4E, the brake ECU 4F, and the steering ECU 4G are connected with the AT 2A, the light 2B, the engine 2C, the brake 2D, and the steering 2E, respectively, in an intercommunicatable manner. The body system LAN N12 is a network that mainly performs inter-instrument communication related to interior decorative member control of the vehicle V. In this example, in the body system LAN N12, the body ECU 4H, the door ECU 4I, the meter ECU 4J, the A/C ECU 4K, the seat ECU 4L, and the keyless ECU 4M are connected in an intercommunicatable manner. In the body system LAN N12, the door ECU 4I, the meter ECU 4J, the A/C ECU 4K, the seat ECU 4L, and the keyless ECU 4M are connected with the door 2F, the meter 2G, the A/C 2H, the seat 2I, and the lock 2J, in an intercommunicatable manner. The information system LAN N13 is a network that mainly performs inter-instrument communication of a multimedia/entertainment system of the vehicle V. In this example, in the information system LAN N13, the front seat display ECU 4N, the TV/radio tuner 4O, the stereo amplifier 4P, the back seat display ECU 4Q, and the navigation ECU 4R are connected in an intercommunicatable manner. In the information system LAN N13, the front seat display ECU 4N, the TV/radio tuner 4O, the stereo amplifier 4P, and the back seat display ECU 4Q are connected with the front seat display 2K, the TV/radio antenna 2L, the audio 2M, and the back seat display 2N, respectively, in an intercommunicatable manner. The safety system LAN N14 is a network that mainly performs inter-instrument communication related to safety control of the vehicle V. In this example, in the safety system LAN N14, the air bag ECU 4S, the passenger sensing ECU 4T, the seat belt ECU 4U, and the detection information processing ECU 4V are connected in an intercommunicatable manner. In the safety system LAN N14, the air bag ECU 4S, the passenger sensing ECU 4T, and the seat belt ECU 4U are connected with the air bag 2O, the passenger sensor 2P, and the seat belt 2Q, respectively, in an intercommunicatable manner.

The inter-network connection unit N10 connects the power train chassis system LAN N11, the body system LAN N12, the information system LAN N13, and the safety system LAN N14 in an intercommunicatable manner. The inter-network connection unit N10 has functions of a protocol conversion unit (what is called a gateway (G/W) functional component) configured to perform protocol conversion and functions of a mainline bus connecting networks. The first network N1 connects the power train chassis system LAN N11, the body system LAN N12, the information system LAN N13, and the safety system LAN N14 through the inter-network connection unit N10 in an intercommunicatable manner by a plurality of protocols different from each other. The inter-network connection unit N10 performs protocol conversion between networks of different protocols and distributes information to the networks. Examples of protocols used in the first network N1 include various kinds of communication protocols related to CAN communication, CAN-FD, LIN, CXPI, NFC, Giga-IR, UWB, Ethernet (registered trademark), HDMI (registered trademark), DSI, wireless transmission communication, USB3.0, Transfer Jet (registered trademark), HomePlug-GreenPHY, wireless LAN communication, sub millimeter wave communication, electrical power line communication (PLC), narrow band wireless communication, weak electric wave communication, and the like, but the protocols are not limited thereto. Function disposition of G/W functional components that function as the protocol conversion unit is not limited to central function disposition as illustrated in FIG. 1, but may be area-distributive function disposition or domain-distributive function disposition. The central function disposition is a disposition form in which the G/W functional components in the vehicle V are disposed at one place in a concentrated manner. The area-distributive function disposition is a disposition form in which the G/W functional components in the vehicle V are disposed in respective optional areas in a distributed manner and cooperated with each other. The domain-distributive function disposition is a disposition form in which the G/W functional components in the vehicle V are disposed in respective optional domains in a distributed manner and cooperated with each other.

In the on-board system 1 configured as described above, the detectors 3, the corresponding detector hub 5, and the controller 4 are connected in an intercommunicatable manner through the second network N2 as illustrated in FIGS. 1, 2, and 3. The second network N2 is a network different from the first network N1 and is a network of another system independent from the first network N1. The second network N2 is a detection-system dedicated communication network connecting the detectors 3, the detector hub 5, and the controller 4 in an intercommunicatable manner. More specifically, the second network N2 connects each of the detectors 3 and the detector hub 5 in an intercommunicatable manner. The second network N2 also connects the detector hubs 5 in an intercommunicatable manner. In addition, the second network N2 connects the detector hub 5 and the controller 4 in an intercommunicatable manner. The second network N2 may be an optional wired or wireless communication network. The coiled code 6 described above forms part of the second network N2.

In this example, the second network N2 includes a network having a ring shape in which the detector hubs 5 are connected in an intercommunicatable manner. In other words, the second network N2 is constituted by what is called a ring topology in which the detector hubs 5, in this example, the four detector hubs 5 are nodes. The second network N2 connects the detector hubs 5 with the respective detectors 3 different from each other in an intercommunicatable manner. The second network N2 also connects each of the two detector hubs 5 on the vehicle front side among the detector hubs 5 and the detection information processing ECU 4V of the controller 4 in an intercommunicatable manner. The second network N2 according to the present embodiment also connects the detectors 3, the corresponding detector hub 5, and the controller 4 in an intercommunicatable manner by a single protocol, for example, Ethernet without the protocol conversion unit such as the inter-network connection unit N10 interposed therebetween.

With the on-board system 1 and each detector hub 5 described above, each of the detectors 3 and the controller 4 can perform intercommunicatable through the detector hub 5. In this case, the detector hub 5 collects the detection information obtained by the detectors 3 and transmits the collected detection information to the controller 4. For example, the on-board system 1 tends to be required to mount various kinds of instruments and detectors 3 in accordance with recent growth of automated vehicle driving. In this case as well, in the on-board system 1, the detection information of the various kinds of detectors 3 can be collected by the detector hub 5 and collectively transmitted to the controller 4, and thus it is possible to prevent communication traffic increase and achieve an appropriate communication speed. For example, the detector hub 5 collects the detection information of the detectors 3 for each constant data frame and collectively transmits the collected detection information to the controller 4 at a constant timing. Accordingly, the detector hub 5 can minimize data frame vacancy and periodically and efficiently transmit the detection information to the controller 4. In addition, since the on-board system 1 collects connection destinations of the detectors 3 by using the detector hub 5, it is possible to have improved wiring operability when various kinds of detectors 3 are mounted on the vehicle V. As a result, the on-board system 1 and the detector hub 5 can achieve appropriate communication.

More specifically, in the on-board system 1 described above, the first network N1 connects each on-board instrument 2 and the controller 4 in an intercommunicatable manner, and the second network N2 connects the detectors 3, the corresponding detector hub 5, and the controller 4 in an intercommunicatable manner. In the on-board system 1, the first network N1 and the second network N2 are independent from each other. With this configuration, the on-board system 1 can perform transmission and reception of the detection information among each of the detectors 3, the detector hub 5, and the controller 4 separately from transmission and reception of other information. Accordingly, in communication related to the detection information, the on-board system 1 can prevent competition with other information communication, and thus can prevent communication traffic increase and achieve an appropriate communication speed. As a result, the on-board system 1 can reflect a result of detection by each of the detectors 3 to processing by the controller 4 and control of each component in a highly responsive manner, and thus can achieve appropriate realtime performance. In addition, in communication related to the detection information, the on-board system 1 can prevent mixture with other information communication, and thus can achieve appropriate reliability. In addition, the on-board system 1 can employ a single protocol, for example, Ethernet in the second network N2 independent from the first network N1, and thus can prevent a calculation load of protocol conversion. As described above, the on-board system 1 and the detector hub 5 can achieve appropriate communication.

In addition, in the on-board system 1 described above, the detector hubs 5 are connected in a ring shape in an intercommunicatable manner through the second network N2. With this configuration, the on-board system 1 can achieve redundancy against breaking and the like in the second network N2 and thus achieve communication among the detector hubs 5, for example, when breaking or the like occurs between some of the detector hubs 5. At this point as well, the on-board system 1 and the detector hubs 5 can achieve more appropriate communication.

In addition, in the on-board system 1 described above, each detector hub 5 includes the anomaly determination unit 54c. With this configuration, in the on-board system 1, the detector hub 5 can collectively perform anomaly determination of the detectors 3 connected with the detector hub 5. As a result, the on-board system 1 can prevent increase of a calculation load on the controller 4 and distribute a calculation load to the detector hubs 5. In addition, the on-board system 1 can prevent anomaly detection information from being continuously transmitted to the controller 4, and thus can prevent communication traffic increase and achieve an appropriate communication speed. At this point as well, the on-board system 1 and the detector hubs 5 can achieve more appropriate communication.

In addition, the on-board system 1 described above includes the coiled code 6 connecting each detector hub 5 with each of the detectors 3 corresponding to the detector hub 5. With this configuration, the on-board system 1 can have improved wiring operability since the coiled code 6 can be freely expanded and contracted. In addition, with this configuration, the on-board system 1 can prevent breaking from occurring between the detector hub 5 and the detector 3 when force is unintentionally applied on the coiled code 6, for example, in collision with another vehicle. At this point as well, the on-board system 1 and the detector hubs 5 can achieve more appropriate communication.

The on-board system and each detector hub according to the embodiment of the present invention described above are not limited to the above-described embodiment but may be changed in various manners within the scope of the claims.

In the above description, the second network N2 connects the detectors 3, the corresponding detector hub 5, and the controller 4 in an intercommunicatable manner by a single protocol but is not limited thereto. The second network N2 may connect the detectors 3, the detector hub 5, and the controller 4 in an intercommunicatable manner by a plurality of protocols different from each other through the protocol conversion unit.

In the above description, the second network N2 includes a network having a ring shape in which the detector hubs 5 are connected in an intercommunicatable manner but is not limited thereto. Specifically, the second network N2 may have what is called bus topology or star topology in place of a ring topology. The bus topology is network topology in which the detector hubs 5 serve as a plurality of nodes and the nodes are connected with each other through one communication line. The star topology is network topology in which the detector hubs 5 serve as a plurality of nodes, and one of the nodes that serves as the center is connected with the other nodes.

In the above description, each detector hub 5 includes the anomaly determination unit 54c but is not limited thereto, and the detector hub 5 may include no anomaly determination unit 54c.

In the above description, the detector connection portion 51 is connected with each detector 3 in a wired manner through the coiled code 6 but is not limited thereto. The detector connection portion 51 may be connected with each detector 3 in a wired manner through a normal electrical line or in a wireless manner.

Computer programs, applications, various kinds of data, and the like described above may be updated as appropriate. For example, all or some of the computer programs, the applications, the various kinds of data, and the like described above may be downloaded as necessary. In addition, for example, all or optional part of the processing function of the controller 4 and the processing unit 54 may be achieved by, for example, a CPU or the like, and a computer program interpreted and executed by the CPU or the like, or may be achieved as hardware such as wired logic.

With an on-board system and a detector hub according to the present embodiment, a plurality of detectors and a controller can perform intercommunicatable through the detector hub. In this case, the detector hub collects detection information obtained by the detectors and transmits the collected detection information to the controller. As a result, the on-board system and the detector hub can achieve appropriate communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An on-board system comprising:
   a plurality of detectors provided to a vehicle;
   a controller configured to control an on-board instrument mounted on the vehicle based on detection information indicating a result of detection by each of the detectors;
   a detector hub interposed between each of the detectors and the controller in an intercommunicatable manner and configured to collect the detection information obtained by the detectors and transmit the collected detection information to the controller;
   a first network connecting the on-board instrument and the controller in an intercommunicatable manner; and
   a second network independent from the first network and connecting the detectors, the detector hub, and the controller in an intercommunicatable manner, wherein
   the first network connects the on-board instrument and the controller through a protocol conversion unit configured to perform protocol conversion in an intercommunicatable manner by a plurality of protocols different from each other, and
   the second network connects the detectors, the detector hub, and the controller in an intercommunicatable manner by a single protocol without the protocol conversion unit.

2. The on-board system according to claim 1, wherein
   a plurality of the detector hubs are provided and each collect the detection information obtained by the detectors different from each other, and the second network includes a network having a ring shape in which the detector hubs are connected in an intercommunicatable manner.

3. The on-board system according to claim 1, wherein the detector hub includes an anomaly determination unit configured to determine anomaly of the detectors.

4. The on-board system according to claim 2, wherein the detector hub includes an anomaly determination unit configured to determine anomaly of the detectors.

5. The on-board system according to claim 1, further comprising:
a coiled code connecting the detector hub and one of the detectors.

6. The on-board system according to claim 2, further comprising:
a coiled code connecting the detector hub and one of the detectors.

7. The on-board system according to claim 3, further comprising:
a coiled code connecting the detector hub and one of the detectors.

8. The on-board system according to claim 4, further comprising:
a coiled code connecting the detector hub and one of the detectors.

9. A detector hub comprising:
a detector connection portion connected with a plurality of detectors provided to a vehicle in an intercommunicatable manner;
a controller connection portion connected with a controller in an intercommunicatable manner, the controller being configured to control an on-board instrument mounted on the vehicle based on detection information indicating a result of detection by each of the detectors; and
a communication processing unit configured to collect the detection information obtained by the detectors and transmit the collected detection information to the controller, wherein
the on-board instrument and the controller are connected in an intercommunicatable manner through a first network,
the detectors and the detector connection portion, the controller connection portion and the controller are connected in an intercommunicatable manner through a second network independent from the first network,
the first network connects the on-board instrument and the controller through a protocol conversion unit configured to perform protocol conversion in an intercommunicatable manner by a plurality of protocols different from each other, and
the second network connects the detectors and the detector connection portion, the controller connection portion and the controller in an intercommunicatable manner by a single protocol without the protocol conversion unit.

* * * * *